United States Patent [19]

Adams

[11] Patent Number: 4,887,352
[45] Date of Patent: Dec. 19, 1989

[54] METHOD FOR MAKING MATRIX LEAD FRAME

[75] Inventor: Anthony L. Adams, Wylie, Tex.

[73] Assignee: Texas Instruments Incorporated, Dallas, Tex.

[21] Appl. No.: 183,543

[22] Filed: Apr. 15, 1988

Related U.S. Application Data

[62] Division of Ser. No. 947,945, Dec. 31, 1986, abandoned.

[51] Int. Cl.[4] .............................................. H01R 43/00
[52] U.S. Cl. ........................................ 29/827; 357/70; 361/421
[58] Field of Search ............... 29/827; 174/52 R, 68.5; 361/421; 357/70

[56] References Cited

U.S. PATENT DOCUMENTS

| | | | |
|---|---|---|---|
| 4,177,519 | 12/1979 | Kasubuchi et al. | 174/68.5 X |
| 4,259,436 | 3/1981 | Tabuchi et al. | 179/52 R X |
| 4,600,971 | 7/1986 | Rose et al. | 361/421 |

FOREIGN PATENT DOCUMENTS

| | | | |
|---|---|---|---|
| 0036850 | 2/1982 | Japan | 357/70 |
| 0062549 | 4/1982 | Japan | 357/72 |
| 0096758 | 6/1984 | Japan | 357/70 |

*Primary Examiner*—Howard N. Goldberg
*Assistant Examiner*—Carl J. Arbes
*Attorney, Agent, or Firm*—B. Peter Barndt; James T. Comfort; Melvin Sharp

[57] ABSTRACT

A system of a plurality of lead frame matrices of standard width to obviate readjustment of matrix handling means of integrated circuit device assembly machinery. A standard width for each lead frame matrix is achieved by incorporating spacing elements into the construction of the lead frame matrices as is necessary to add to the width of the lead frame matrix to bring it up to standard width. The width of a lead frame matrix includes the lead frames along the width, the spacing elements and matrix guide bars.

7 Claims, 2 Drawing Sheets ns of material of 4,887,352

METHOD FOR MAKING MATRIX LEAD FRAME

This is a divisional application Ser. No. 947,945, filed on Dec. 31, 1986, now abandoned, entitled MATRIX LEAD FRAME TO MANUFACTURE MULTITUDE OF IC PACKAGES.

BACKGROUND OF THE INVENTION

1. Field of the Invention

This invention relates to the manufacture of integrated circuit devices, and in particular, to matrix lead frame configurations designed to facilitate the assembly of integrated circuit devices.

2. Related Art

The advent of surface mount technology has given rise to a proliferation of new sizes and shapes for integrated circuit devices. These new device styles include Small Outline IC's (SOIC's), Plastic Leaded Chip Carriers (PLCC's), and Small Outline J-leaded devices (SOJ's), all well known to those skilled in the art. In addition, integrated circuit devices in the familiar DIP package style come in a large variety of sizes and shapes.

Most integrated circuit devices are assembled around a lead frame. These lead frames come in a large variety of sizes and shapes. Typically, the lead frames themselves are manufactured in long strips of many individual units. These long strips are wide enough to accommodate from one to approximately three or four lead frames. When a strip of lead frames is more than one lead frame wide, the strip is referred to as a matrix. In the present invention, a lead frame matrix refers to a strip of lead frames which includes one or more lead frames along its width.

The state of the prior art is such that each matrix of a given size and shape lead frame has its own unique width determined by the width of an individual lead frame and the number of lead frames making up the width of the matrix. Thus, the state of the prior art is such that there is great variety in the widths of matrices.

Typically, final assembly of an integrated circuit device requires that a semiconductor chip be affixed to the bar pad of a lead frame and that the leads of the lead frame be electrically connected to the integrated circuit on the upper surface of the semiconductor chip. Subsequently, the leadframe and affixed semiconductor chip are packaged in a material such as plastic. One of the last assembly steps is "trim and form" in which any excess leadframe material is trimmed away and the leads protruding from the packaging material are bent to their final form.

Often, the machinery for carrying out the final assembly includes means well known in the art for handling a matrix of lead frames. Because of the diversity of matrix widths, the prior art matrix handling means are adjustable to a number of different widths. Integrated circuit assembly machinery is very expensive, so the same machinery is made adaptable to assemble a variety of different types of Integrated circuit devices, each type having its own characteristic size and shape.

Unfortunately, the matrix handling means usually require a down time of from four to eight hours to change over so that they can handle a different width lead frame matrix. Associated with this amount of down time is a yield loss for the next twenty-four hours of approximately five to ten percent.

SUMMARY OF THE INVENTION

The invention provides for a standard width lead frame matrix that includes a plurality of individual lead frames of a particular size and shape selected from among a group of possible lead frame sizes and shapes. The matrix includes spacing elements appropriately sized and positioned to achieve a standard width matrix for a given group of possible lead frame sizes and shapes. All the different lead frame sizes and shapes used by a particular manufacturer of integrated circuit devices can be divided into one or two groups, each group being associated with a lead frame matrix of a particular standard width.

The lead frame matrix of the invention considerably reduces the down time associated with adjusting the matrix handling means so that they will accommodate a new size matrix. The invention allows the same matrix handling means setting to be used in the manufacture of any integrated circuit device whose lead frame size and shape falls within the group for whose standard width matrix the machine is already adjusted. Thus, it is possible for a manufacturer of integrated circuit devices to choose a standard width matrix that can accommodate any of the the shapes and sizes of lead frames that he uses, so that he will never need to change the matrix handling means in order to assemble a different type of integrated circuit.

These and other objects and advantages of the invention will be apparent from a reading of the specification in conjunction with the figures.

DESCRIPTION OF THE PREFERRED EMBODIMENTS

Figure 1:
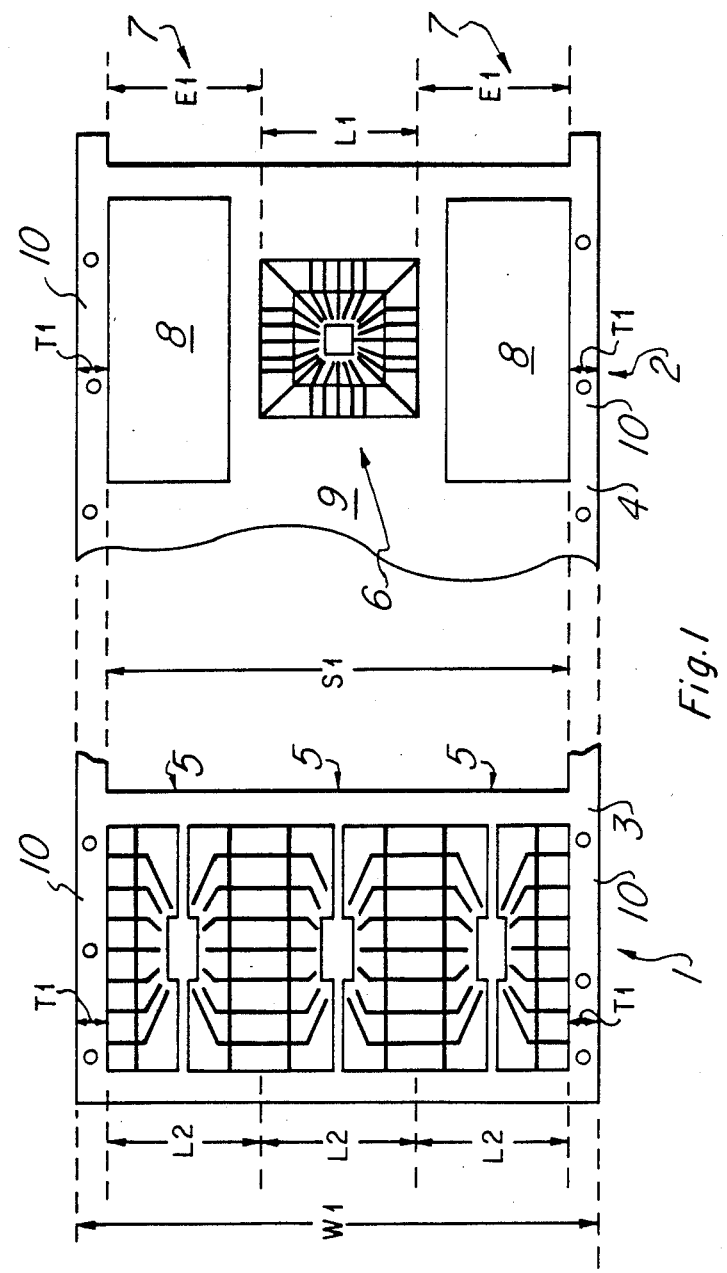
FIG. 1 shows a section of a lead frame matrix for a DIP on the left, and a section of a lead frame matrix for a PLCC on the right. The sections were taken along the width of equal width matrices.

Turning to FIG. 1, one embodiment of the invention is illustrated in which lead frame matrix 1 for DIP integrated circuit devices and matrix 2 for PLCC integrated circuit devices are of the same width W1. Lead frame matrix materials 3 and 4 can be any one of the typical metals such as copper or Alloy 42. To practice the invention, the metal 3 for matrix 1 may be of a different metal than the metal 4 of matrix 2, or they may be the same.

The DIP lead frames 5 and the PLCC lead frame 6 are themselves formed as is well known in the art, but the invention provides for spacing elements 7 in PLCC matrix 2 to ensure that PLCC lead frame matrix 2 has the same width W1 as DIP matrix 1. With W1 the same, the matrix handling means of integrated circuit device assembly machinery does not have to be readjusted when production is switched from the DIP devices of FIG. 1 to the PLCC devices of FIG. 1, or vice versa.

As illustrated in FIG. 1, the spacing elements 7 are a combination of open areas 8 and structurally reinforcing solid areas 9 of the lead frame matrix 2. It is obvious that the spacing elements 7 could consist solely of areas of solid lead frame material 4. By including open areas 8 as part of the spacing elements 7, the total weight of the matrix 2 is reduced. The weight reduction is appreciable when the matrices 2 are very long with many lead frames. Preferably, the open area spacing elements are formed at the same time and in the same manner as are the lead frames, by stamping or any other well known method.

In FIG. 1, the two spacing elements 7 are each of width E1, and the width of the PLCC lead frame is L1. This gives an interior width of S1=E1+L1+E1, for the PLCC lead frame matrix 2. In the embodiment of the invention illustrated in FIG. 1, DIP matrix 1 is formed without spacing elements since the three DIP lead frames 5 exactly fill the width S1 of matrix 1. That is, S1=L2+L2+L2, where L2 is the width of each DIP lead frame. Thus, the interior width is S1 for DIP lead frame matrix 1 and for the PLCC lead frame matrix 2. The width T1 is the same for the matrix guide bars 10 for both the PLCC and DIP matrices 2 and 1 respectively. Consequently, the total widths of the PLCC and DIP matrices are equal and are both W1, where W1=T1+L2+L2+L2+T1 for the DIP matrix 1, and W1=T1+E1+L1+E1+T1 for the PLCC matrix 2.

Figure 2:
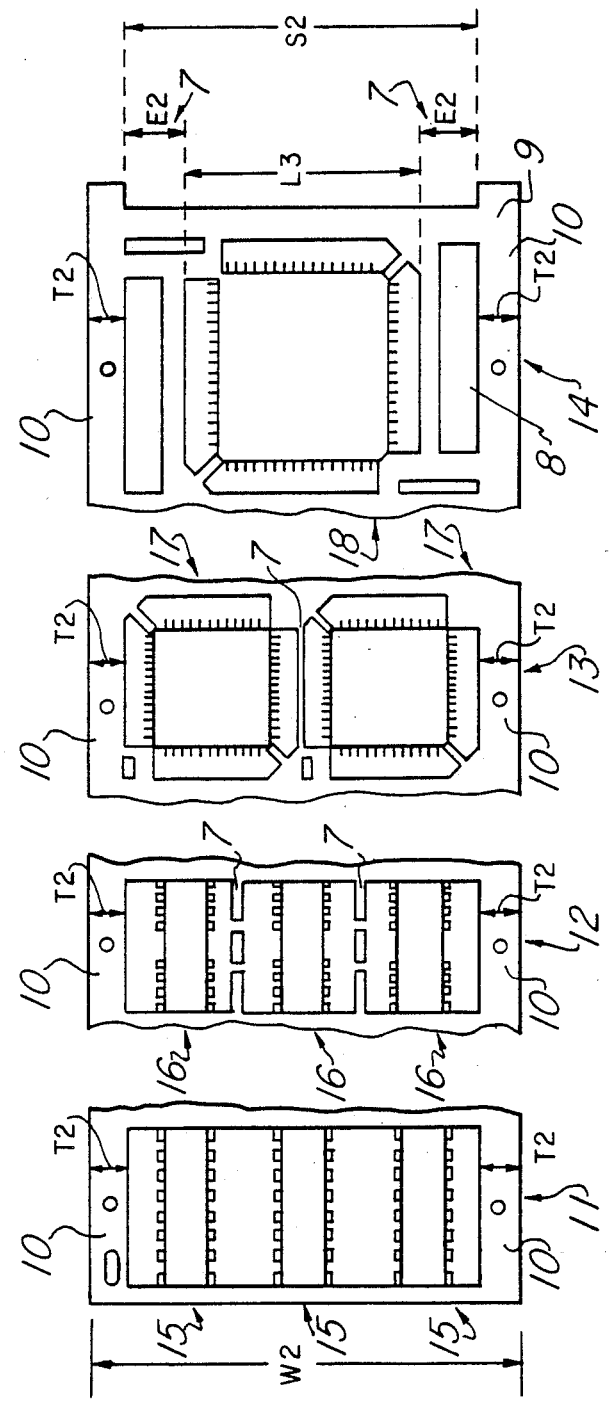
FIG. 2 shows sections of lead frame matrices for, from left to right, DIP's, SOJ's, PLCC's, and a larger size PLCC. Plastic packaging material surrounds all but the protruding portion of the leads of each lead frame. The sections were taken along the width of equal width matrices.

Turning to FIG. 2, four lead frame matrices are shown, each with standard width W2. In FIG. 2 the lead frames 15, 16, 17 and 18 have been plastic packaged but have not yet been cut away from the lead frame matrices 11, 12, 13 and 14, respectively.

Similarly to the DIP lead frame matrix of FIG. 1, DIP lead frame matrix 11 has no spacing elements 7. SOJ lead frame matrix 12 is shown having two spacing elements 7. PLCC lead frame matrix 13 is illustrated having one spacing element 7. PLCC lead frame matrix 14 is for a larger size PLCC than is matrix 13, and has two spacing elements 7. Each of the lead frame matrices is of equal width W2, each has the same inner width S2, and each has matrix guide bars 10 of width T2.

As with the embodiment illustrated in FIG. 1, the embodiment shown in FIG. 2 is arranged so that for each lead frame matrix, the sum of the widths of the lead frames plus the sum of the widths of the spacing elements 7 is equal to the inner width (S2 in FIG. 2). That is, for a given standard width matrix, the total width of the spacing elements is determined by the width and number of lead frames along the width of the matrix. For example, looking at matrix 14, S2=E2+L3+E2, and W2=T2+S2+T2. As is the case with matrix 2 of FIG. 1, the spacing element 7 of matrix 14 includes an open area 8 and a reinforcing solid area 9.

As should be obvious to those skilled in the art, the spacing elements 7 may be of many shapes and combinations of open and solid areas and still be within the compass of the invention. The invention is not limited to the specific embodiments illustrated and is useful with integrated circuit device package styles in addition to those (DIP, PLCC, SOJ) specifically illustrated.

Preferably, the number of standard widths for the lead frame matrices will be limited to one or two in order to minimize the amount of time spent readjusting the matrix handling means. However, any small number of standard widths is within the scope of the invention.

I claim:

1. A method for standardizing the width of a lead frame matrix, wherein the lead frame matrix is an array of a plurality of lead frames of a single size and shape selected from a group of possible sizes and shapes, comprising the steps of:

providing one or more spacing elements along the width of said lead frame matrix, sufficiently wide to contribute to the width of said lead frame matrix so that said lead frame matrix is of said standard width;

calculating the width of said spacing elements by:

(a) adding the widths of two matrix guide bars of said lead frame matrix to get a partial sum;

(b) adding to said partial sum the widths of as many lead frames as are along the width of said lead frame matrix to update said partial sum; and (c) subtracting said updated partial sum from said standard width to be taken up by spacing elements.

2. The method of claim 1 further comprising the steps of:

forming one or more of said one or more spacing elements to include an open area; and cutting away a portion of said spacing elements to form an open area.

3. The method of claim 1 further comprising the step of:

providing more than one lead frame along the width of said lead frame matrix at each point along the length of said lead frame matrix where a lead frame is located.

4. A method for standardizing the width of a lead frame matrix, wherein the lead frame matrix is an array of a plurality of lead frames of a single size and shape selected from a group of possible sizes and shapes, comprising the steps of:

providing one or more spacing elements along the width of said lead frame matrix, sufficiently wide to contribute to the width of said lead frame matrix so that said lead frame matrix if of said standard width;

forming one or more of said one or more spacing elements to include an open area;

cutting away a portion of said spacing elements to form an open area;

providing more than one lead frame along the width of said lead frame matrix at each point along the length of said lead frame matrix where a lead frame is located;

calculating the width of said spacing elements by adding the widths of two matrix guide bars of said lead frame matrix to get a partial sum;

adding to said partial sum the widths of as many lead frames as are along the width of said lead frame matrix to update said partial sum; and subtracting said updated partial sum from said standard width to get the total width to be taken up by spacing elements.

5. A method for standardizing the width of a lead frame matrix, wherein the lead frame matrix is an array of a plurality of lead frames of a single size and shape selected from a group of possible sizes and shapes, comprising the steps of:

providing one or more spacing elements along the width of said lead frame matrix, sufficiently wide to contribute to the width of said lead frame matrix so that said lead frame matrix is of said standard width; and providing more than one lead frame along the width of said lead frame matrix at each point along the length of said lead frame matrix where a lead frame is located.

6. The method of claim 5 further comprising the steps of calculating the width of said spacing elements by:

(a) adding the widths of two matrix guide bars of said lead frame matrix to get a partial sum;
(b) adding to said partial sum the widths of as many lead frames as are along the width of said lead frame matrix to update said partial sum; and
(c) subtracting said updated partial sum from said standard width to get the total width to be taken up by spacing elements.

7. The method of claim 5 further comprising the steps of:
   forming one or more of said one or more spacing elements to include an open area; and
   cutting away a portion of said spacing elements to form an open area.

* * * * *